US006729755B1

(12) United States Patent
Yin

(10) Patent No.: US 6,729,755 B1
(45) Date of Patent: May 4, 2004

(54) LOW POWER, COST EFFECTIVE, TEMPERATURE COMPENSATED REAL TIME CLOCK AND METHOD OF CLOCKING SYSTEMS

(75) Inventor: Rong Yin, Coppell, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/546,276

(22) Filed: Apr. 10, 2000

Related U.S. Application Data

(62) Division of application No. 08/822,601, filed on Mar. 20, 1997.

(51) Int. Cl.[7] .......................... G04B 17/20; G01R 23/00; H03L 1/00

(52) U.S. Cl. .......................... 368/202; 331/44; 331/176

(58) Field of Search .......................... 368/202; 331/44, 331/175–176; 374/100–185

(56) References Cited

U.S. PATENT DOCUMENTS

| | | | | | |
|---|---|---|---|---|---|
| 3,938,316 | A | | 2/1976 | Morokawa et al. | |
| 3,999,370 | A | | 12/1976 | Morokawa et al. | |
| 4,020,626 | A | | 5/1977 | Kuwabara et al. | |
| 4,094,137 | A | * | 6/1978 | Morokawa | 331/116 FE |
| 4,321,698 | A | | 3/1982 | Gomi et al. | |
| 4,325,036 | A | * | 4/1982 | Kuwabara | 331/162 |
| 4,370,067 | A | * | 1/1983 | Iwakura et al. | 327/176 |
| 4,443,116 | A | * | 4/1984 | Yoshida et al. | 331/158 |
| 4,453,834 | A | * | 6/1984 | Suzuki et al. | 331/111 |
| 4,465,379 | A | * | 8/1984 | Misawa et al. | 368/202 |
| 4,465,380 | A | * | 8/1984 | Murata et al. | 368/202 |
| 4,473,303 | A | * | 9/1984 | Suzuki | 368/201 |
| 4,730,286 | A | * | 3/1988 | Aizawa et al. | 368/200 |
| 4,737,944 | A | | 4/1988 | Inoue et al. | |
| 4,761,771 | A | * | 8/1988 | Moriya et al. | 368/202 |
| 5,125,112 | A | | 6/1992 | Pace et al. | |
| 5,341,112 | A | | 8/1994 | Haman | |
| 5,473,289 | A | * | 12/1995 | Ishizaki et al. | 331/176 |
| 5,491,456 | A | | 2/1996 | Kay et al. | |

OTHER PUBLICATIONS

Digital Circuits Textbook, p. 246.

43rd Annual Symposium of Frequency Control, "Low Power Timekeeping", 1989, Martin Bloch, Marvin Meirs, John Ho, John R. Vig and Stanley Schodowski.

* cited by examiner

*Primary Examiner*—David Martin
*Assistant Examiner*—Michael L. Lindinger
(74) *Attorney, Agent, or Firm*—Lisa K. Jorgenson; Christopher F. Regan

(57) ABSTRACT

A temperature compensated clock and method of clocking systems are provided. The clock preferably has an oscillator for generating an oscillating waveform signal at a preselected frequency and a frequency divider responsive to the oscillator for dividing the frequency of the oscillating waveform signal. A temperature monitoring circuit is positioned responsive to a voltage input signal independent of temperature and a voltage input signal proportional to temperature for monitoring temperature variations. A temperature compensating circuit, preferably including a programmable scaling circuit, is responsive to the frequency divider and the temperature monitoring circuit for scaling the divided frequency of the generated waveform and thereby advantageously produces a temperature compensated output timing signal.

11 Claims, 4 Drawing Sheets

LOW POWER, COST EFFECTIVE, TEMPERATURE COMPENSATED REAL TIME CLOCK AND METHOD OF CLOCKING SYSTEMS

This application is a division of Ser. No. 08/822,601 filed on Mar. 20, 1997, the disclosures of which are hereby incorporated by reference in their entirety.

FIELD OF THE INVENTION

The present invention relates to electronic systems and, more particularly, to the field of electronic timing systems.

BACKGROUND OF THE INVENTION

Over the years, various electronic timing systems, clocks, or clocking circuits for electronic systems have been developed. Clocks often use a crystal oscillator, e.g., a quartz-crystal resonator, for frequency stability. The very high stiffness and elasticity of piezoelectric quartz make it possible to produce resonators extending from approximately 1 KHz to 200 MHz. Clocks using a crystal oscillator, for example, have been developed which operate at low power and maintain good accuracy at low cost. The disadvantage of these clocks, however, is that they can maintain their timing accuracy only over a narrow temperature range. Outside this narrow temperature range, the frequency variation becomes quite large and the timing error increases considerably. Some of these timing inaccuracies, for example, can be attributed to the inadequate performance of the crystal oscillator.

The performance characteristics of a crystal oscillator, e.g., a quartz-crystal resonator, generally depend on both the particular cut and the mode of vibration. Each "cut-mode" combination is considered as a separate piezoelectric element, and the more commonly used elements often are designated with letter symbols. The temperature coefficient of the frequency of the crystal varies with different cuts, i.e., with the crystal dimensions, and, generally, a parabolic frequency variation with temperature can be observed.

In order to improve the frequency accuracies of clocks, some clocks have also been developed which use a high precision crystal oscillator with a better temperature coefficient, such as a temperature compensated crystal oscillator ("TCXO"). The TCXO requires a temperature sensor and a more accurate crystal. These clocks, however, have the disadvantages of requiring considerably more power, size, and weight than the original simple clock. Also, these clocks are generally more expensive due to the complicated design and the high cost of the special crystal.

Another conventional approach for a clock is to use two crystals. Instead of using a high precision crystal oscillator and a temperature sensor to measure the temperature (e.g., a TXCO), a very temperature stable high frequency crystal or oscillator is used in this approach as a reference frequency. The high frequency crystal has good performance characteristics over the operating temperature range. In other words, the frequency change versus temperature variation is a relatively flat line instead of a parabolic curve. This high frequency crystal can be used to generate a reference frequency, for example, every 10 minutes. Meanwhile, another normal crystal, e.g., 32 KHz, of the clock also is always operating or running and requires only a low level of current. The normal crystal operates in a dual mode by turning one of the load capacitors on and off. This means that the crystal either has a fast frequency by about 75 parts per million ("ppm") or a slow frequency by 35 ppm. By comparing the 32 KHz frequency with the reference frequency every 10 minutes, the 32 KHz frequency can be adjusted automatically by selecting the dual mode operating time. Nevertheless, a clock using this approach is expensive and can be complex.

SUMMARY OF THE INVENTION

With the foregoing in mind, the present invention advantageously provides a cost effective temperature compensated real time clock which does not require an additional crystal or a microprocessor. The present invention also advantageously provides a real time clock and method that produce a timing signal which has been calibrated or compensated for various changes in temperature which may occur over time. The present invention further advantageously provides a simple, low power, and inexpensive real time clock and method for use in various systems.

More particularly, a temperature compensated clock is provided according to the present invention and preferably has waveform generating means for generating a waveform at a preselected frequency. Temperature monitoring means is advantageously responsive to a voltage input signal independent of temperature and a voltage input signal proportional to temperature for monitoring variations in temperature. The clock also has temperature compensating means responsive to the waveform generating means and the temperature monitoring means for compensating for frequency variations in the generated waveform due to temperature changes and thereby produce a temperature compensated output timing signal.

In a temperature compensated clock according to the present invention, the waveform generating means is preferably provided by an oscillator for generating an oscillating waveform signal at a preselected frequency and a frequency divider responsive to the oscillator for dividing the frequency of the oscillating waveform signal. The temperature monitoring means advantageously subtracts the input voltage signal proportional to temperature from the input voltage signal independent of temperature to thereby generate a difference signal. The input voltage signal proportional to temperature preferably is generated internal to the clock of the present invention. This difference signal preferably is converted to a digital format.

The temperature compensating means of the present invention preferably includes a programmable. scaling circuit, responsive to the generated waveform signal and the digital difference signal, for scaling the frequency of the generated waveform and thereby produce an accurate temperature compensated output timing signal. The programmable scaling circuit advantageously has pulse counting means for counting a predetermined total number of timing pulses. The pulse counting means preferably includes a pair of counters which separately count a predetermined portion of the total of number of timing pulses. At least one of the pair of counters is preferably programmable so that the accuracy of the desired scaled frequency output timing signal can be flexibly adjusted.

The programmable counter of the programmable scaling circuit preferably receives the digital difference signal periodically sampled from the temperature monitoring means and responsively counts the programmed number of pulses. The output of the pulse counting means provides a control signal for an input to scaling means for scaling the predetermined waveform frequency. The second counter of the pulse counting means, in turn, receives a divided and scaled output signal from a dividing circuit which is responsive to the scaling means. The second counter counts a number of pulses preferably proportional to the desired scaled frequency output timing signal.

By providing the temperature compensating means of the clock which includes a programmable scaling circuit according to the present invention, the clock can advantageously be flexibly adapted or designed for an accurate desired frequency output. Accordingly, the system designer can flexibly balance or make trade-offs between increased clock accuracy and costs or power usage. Also, by recognizing these flexible system constraints, a simplified and inexpensive real time clock, as well as methods of clocking systems, is provided according to the present invention.

The present invention also advantageously includes methods of clocking systems. A method of clocking systems preferably includes generating a waveform signal at a preselected frequency and monitoring temperature variations responsive to an input voltage signal independent of temperature and an input voltage signal proportional to temperature. The method also includes generating a difference signal representative of the difference between the input voltage signal independent of temperature and the input voltage signal proportional to temperature and scaling the frequency of the generated waveform responsive to the difference signal to thereby produce a temperature compensated output timing signal.

Another method of clocking systems includes monitoring an input voltage signal independent of temperature and an input voltage signal proportional to temperature for variations in temperature. Frequency variations in a generated waveform are compensated for in a system responsive to the monitored temperature variations to thereby produce a temperature compensated output timing signal.

By providing an internal temperature dependent voltage generating circuit and using a temperature independent voltage reference signal, a clock and methods of clocking systems of the present invention advantageously monitor temperature variations as a difference signal only at periodic times so to save power for the clock. This difference signal can advantageously be converted to a digital format so that the programmable scaling circuit can readily adjust for frequency variations due to temperature changes over time. The present invention also advantageously allows a low cost waveform generator, such as an inexpensive or low cost crystal, to be used as an input to the clock and yet produce a fairly accurate clock output signal the frequency of which does not vary greatly due to changes in temperature, i.e., compensates for frequency variations over temperature.

BRIEF DESCRIPTION OF THE DRAWINGS

Some of the features, advantages, and benefits of the present invention having been stated, others will become apparent as the description proceeds when taken in conjunction with the accompanying drawings in which.

DETAILED DESCRIPTION OF THE PREFERRED EMBODIMENTS

The present invention will now be described more fully hereinafter with reference to the accompanying drawings which illustrate preferred embodiments of the invention. This invention may, however, be embodied in many different forms and should not be construed as limited to the illustrated embodiments set forth herein. Rather, these illustrated embodiments are provided so that this disclosure will be thorough and complete, and will fully convey the scope of the invention to those skilled in the art. Like numbers refer to like elements throughout, and prime notation is used to indicate similar elements in alternative embodiments.

Figure 1:
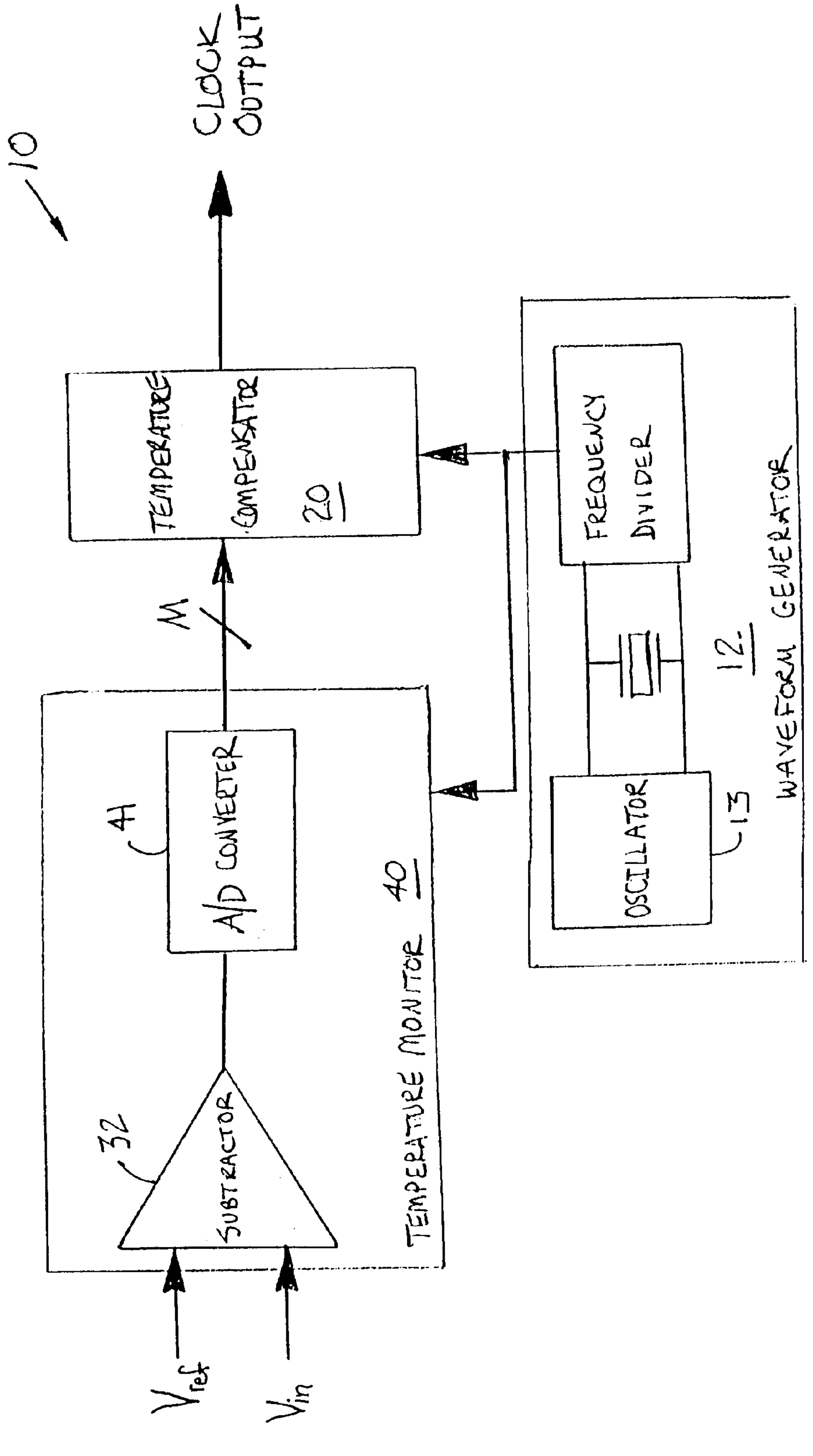
FIG. 1 is a schematic block diagram of a temperature compensated clock according to an embodiment of the present invention.

FIG. 1 illustrates a cost effective temperature compensated real time clock 10 that does not require an additional crystal oscillator, or a microprocessor. The clock preferably has waveform generating means 12 for generating a waveform at a preselected frequency. The waveform generating means 12 is preferably provided by a low power crystal oscillator 13 that does not require any adjustment. The low power crystal oscillator 13, for example, can be a conventional 32 KHz crystal oscillator, as understood by those skilled in the art, which generates an oscillating frequency of about 32 KHz, e.g., 32,768 Hz. This conventional low power crystal oscillator, e.g., a quartz-crystal resonator, is known and relatively inexpensive. The crystal oscillator preferably has low power, e.g., less than 2 micro-Watts, and operates at a low voltage, e.g., 3 Volts. By using a lower frequency oscillator, the power consumption and cost of the clock advantageously can be reduced. The clock 10 of the present invention advantageously allows a low cost waveform generator 12, including an inexpensive or low cost crystal 13, to be used as an input to the clock 10 and yet produce a fairly accurate output signal the frequency of which does not vary greatly due to changes in temperature, i.e., compensates for frequency variations over temperature, as described further herein.

The waveform generating means 12 also preferably includes a frequency divider 14 preferably connected to the oscillator 12 for dividing the frequency of the generated oscillating waveform. The frequency divider, for example, can be a divide by $2^3$ or a 3 flip-flop circuit, as understood by those skilled in the art, which produces an output frequency of about 4 KHz (i.e., 4,096 Hz).

The clock 10 preferably also includes temperature compensating means 20 responsive to the waveform generating means 12, e.g., connected to the frequency divider 14, for compensating for the frequency variations of the generated waveform due to temperature variations to produce a temperature compensated output timing signal. The temperature compensating means 20 is preferably provided by a programmable scaling or divider circuit that uses the 4 KHz signal from the frequency divider 14 as its input and produces an adjusted 1 Hz output signal by using temperature monitoring means 30, e.g., provided by a temperature monitoring circuit, also connected to the temperature compensating means 20. The temperature monitoring means 30 preferably is designed and constructed to only periodically monitor changes in temperature.

As illustrated in FIG. 1, the temperature monitoring means 30 of the clock 10 preferably has subtracting means 32, e.g., provided by a differential amplifier or other subtractor as understood by those skilled in the art, for advantageously determining a difference between a temperature independent input signal and an input signal proportional to temperature to thereby produce an output difference signal.

The input signals preferably are a reference voltage signal $V_{ref}$ and a temperature dependent voltage signal $V_{in}$. As understood by those skilled in the art, the reference voltage $V_{ref}$ is preferably provided by a reference signal generated by a bandgap circuit and is preferably independent of temperature and a supply voltage. The temperature dependant voltage signal $V_{in}$, on the other hand, is preferably linearly dependent on temperature and can be generated for example, by voltage generating means 60 as illustrated in FIG. 2 and as described further herein.

Converting means, e.g., provided by an analog-to-digital ("A/D") convertor 41, is preferably connected to the subtracting means 32 for converting the output difference signal to a predetermined digital output format. The subtracting means 32 and the A/D convertor 41 preferably are only periodically powered to reduce the total power consumption of the clock 10. Latching means 36, e.g., a latch (FIG. 3), is preferably connected to the converting means and connected to the temperature compensating means 20 for periodically latching the temperature compensating means 20 with a digital input signal to thereby supply the temperature compensating means with a digital representation of temperature variation. The latching circuit means 36 preferably is a latching which allows the digital output signal to be periodically latched after sampling.

Figure 2:
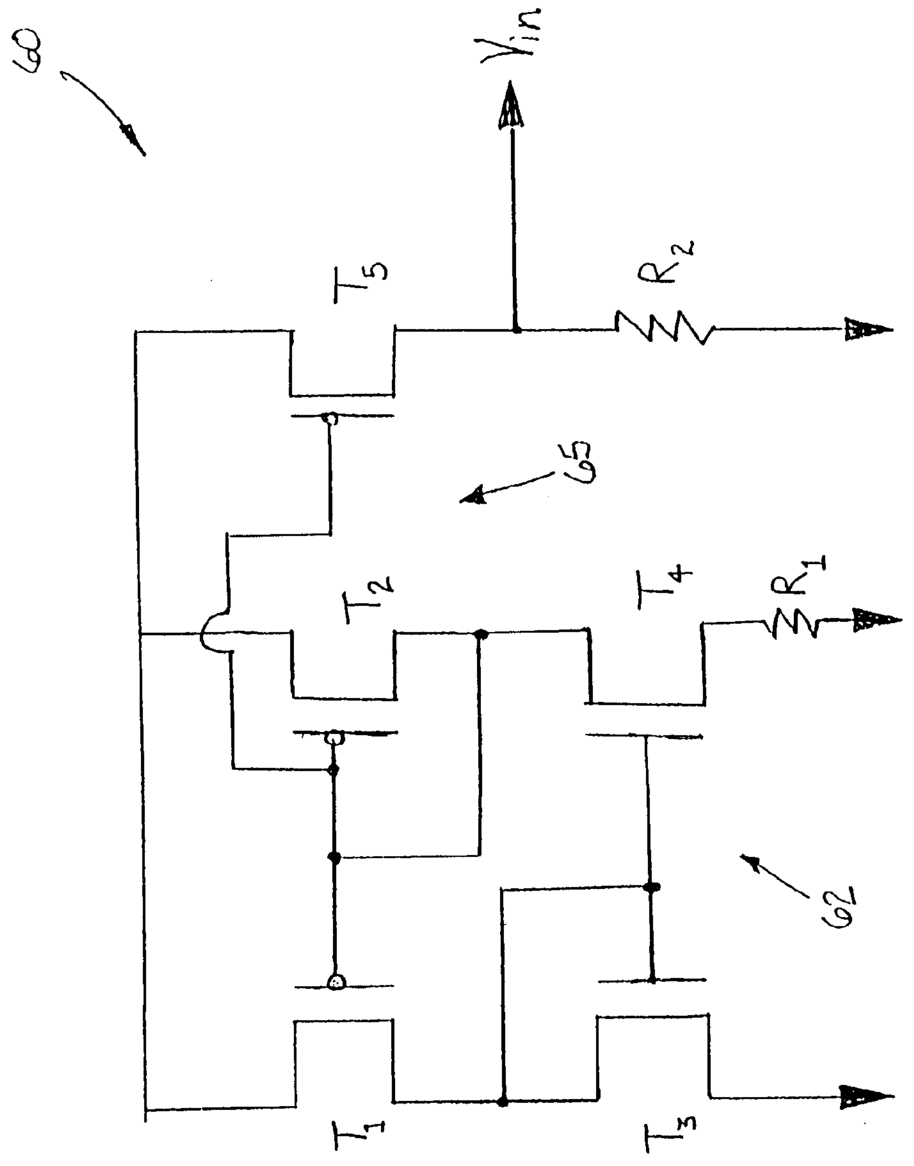
FIG. 2 is a schematic circuit diagram of a voltage generating circuit of a temperature compensated clock according to an embodiment of the present invention.

The voltage generating means 60, as illustrated in FIG. 2, preferably has a plurality of transistors $T_1$, $T_2$, $T_3$, $T_4$, $T_5$, e.g., PMOS and NMOS type transistors, and a plurality of resistors $R_1$, $R_2$. As understood by those skilled in the art, the plurality of transistors $T_1$, $T_2$, $T_3$, $T_4$, $T_5$ illustrated in FIG. 2 preferably are operated at weak inversion. The plurality of transistors $T_1$, $T_2$, $T_3$, $T_4$, $T_5$ and the plurality of resistors $R_1$, $R_2$ preferably form a current source circuit 62 and a current mirror circuit 65 connected to the current source circuit 62.

At least two pairs $T_1$, $T_2$, $T_3$, $T_4$, e.g., two PMOS and two NMOS, of the plurality of transistors $T_1$, $T_2$, $T_3$, $T_4$, $T_5$ of the voltage generating means 60 form the current source circuit 62 with a resistor $R_1$. Each pair of transistors $T_1$, $T_2$, $T_3$I $T_4$, preferably has respective gates thereof connected to each other. Where Temp is temperature, the current $I_o$ is proportional to Temp/$R_1$. At least one transistor $T_2$, e.g., PMOS, from the current source circuit 62 and an additional transistor $T_5$, e.g., PMOS, connected to the gate of the at least one transistor $T_2$ establish current mirroring, i.e., the current mirror circuit 65, and have a gain of $S_5/S_2$. Where S indicates the size of a transistor (S=W/L). Then the voltage signal $V_{in}$ is proportional to temperature, Temp, e.g., linearly dependent on temperature.

Figure 3:
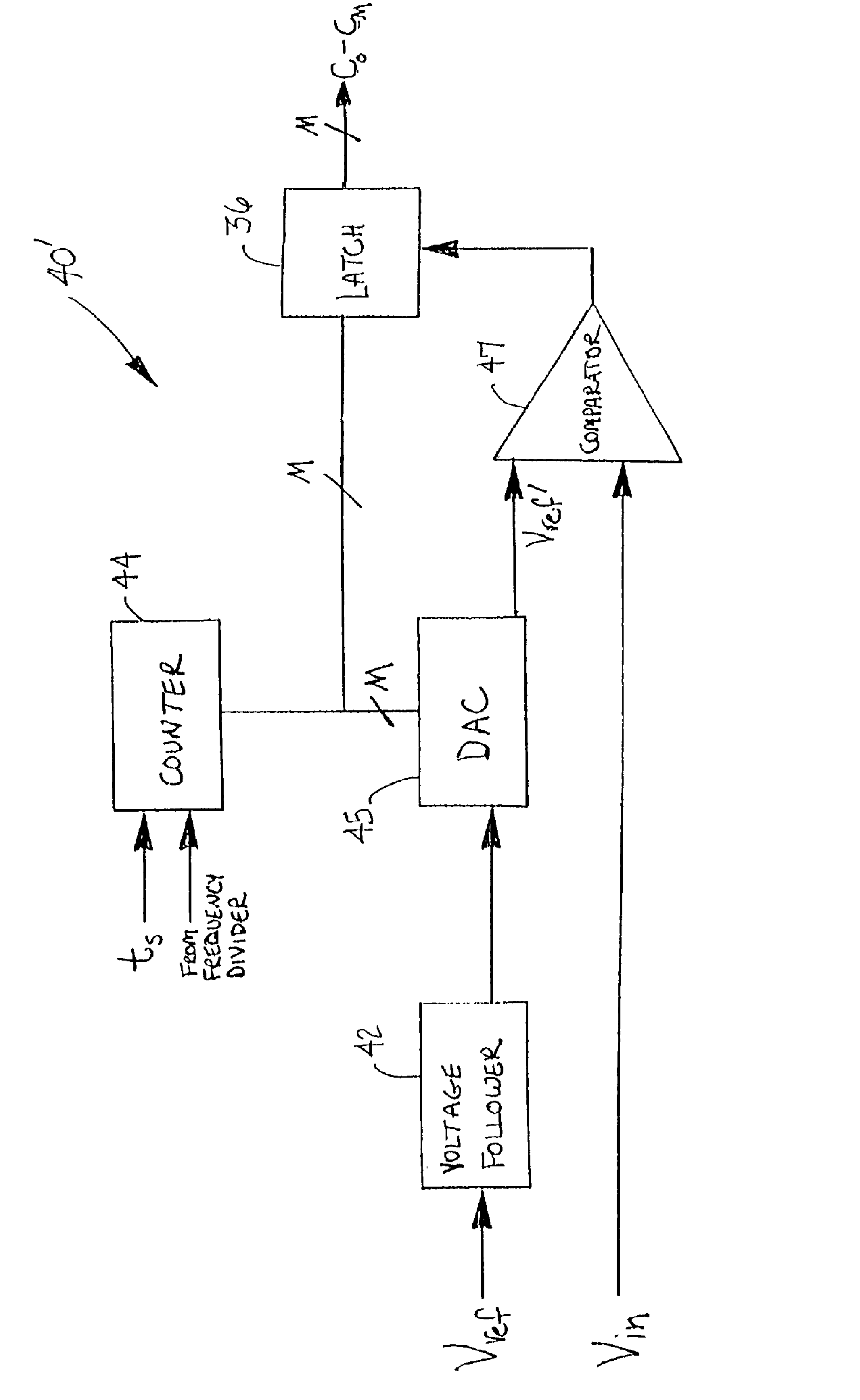
FIG. 3 is a schematic block diagram of a converting circuit of a temperature compensated clock according to another embodiment of the present invention.

As illustrated in the embodiment of FIG. 3, the subtracting or differentiating function and the conversion of the temperature monitoring means 40' are implemented by using a slightly modified analog-to-digital converting circuit. Because the temperature monitoring means 40' is only periodically sampled, the A/D converting circuit advantageously can be relatively slow. This slow A/D converter circuit can then save power and be less expensive.

The temperature monitoring means 40' illustratively includes a counting circuit 44 responsive to a timing signal $t_s$ and the frequency output signal of the waveform generating means 12 for counting pulses. A voltage following circuit 42, e.g., an amplifier with feedback or other circuit, as understood by those skilled in the art, wherein the output voltage is the same as the input voltage, receives a temperature independent voltage input signal $V_{ref}$ and follows the voltage input signal $V_{ref}$ to thereby produce an analog voltage output signal. A digital-to-analog convertor ("DAC") 45 is connected to the counting circuit 44 and the voltage following circuit 42 for converting the output of the counting circuit 44 to an analog format by varying $V_{ref}$ to provide an adjusted voltage output $V_{ref}$. The DAC 45 is preferably a simple resistor array,as understood by those skilled in the art.

Comparing means 47, e.g., a comparator, is connected to the DAC 45 and the voltage generating means 60 (FIG. 2) for comparing the analog output signal of the DAC 45 and the temperature dependent voltage signal, i.e., output of the voltage generating means, to thereby produce a digital signal representative of a temperature variation. In other words, if or when the temperature dependent voltage input signal $V_{in}$ changes, this change is compared to the temperature independent reference voltage input signal $V_{ref}$. The comparator 47 then generates a digital signal representative of the difference between the two input voltages $V_{in}$, $V_{ref}$.

The counter circuit input signal $t_s$ in FIG. 3 preferably is a periodic pulse the period of which is advantageously predetermined by a clock designer, e.g., every 10 minutes. By only performing a periodic pulse or sampling, power consumption in the circuit is reduced. The pulse width of the input signal $t_s$ preferably is determined by the output of the comparator 47. This pulse preferably is also used to control the power to the voltage following circuit 42, the DAC 45, and the comparator 47 in order to further reduce overall current consumption of the clock 10. The latching circuit 36 produces a digital output, e.g., calibration bits $C_0$–$C_M$, which can be latched after every sampling pulse, e.g., every 10 minutes. Although the period for sampling can be decreased by a clock designer to achieve improved accuracy, the designer should perform a balance or trade-off between the incremental improvements in accuracy and the increased power usage required by this additional accuracy. Nevertheless, these type of design constraints advantageously provides design flexibility for the clock 10 when a designer wants a desired clock output.

Figure 4:
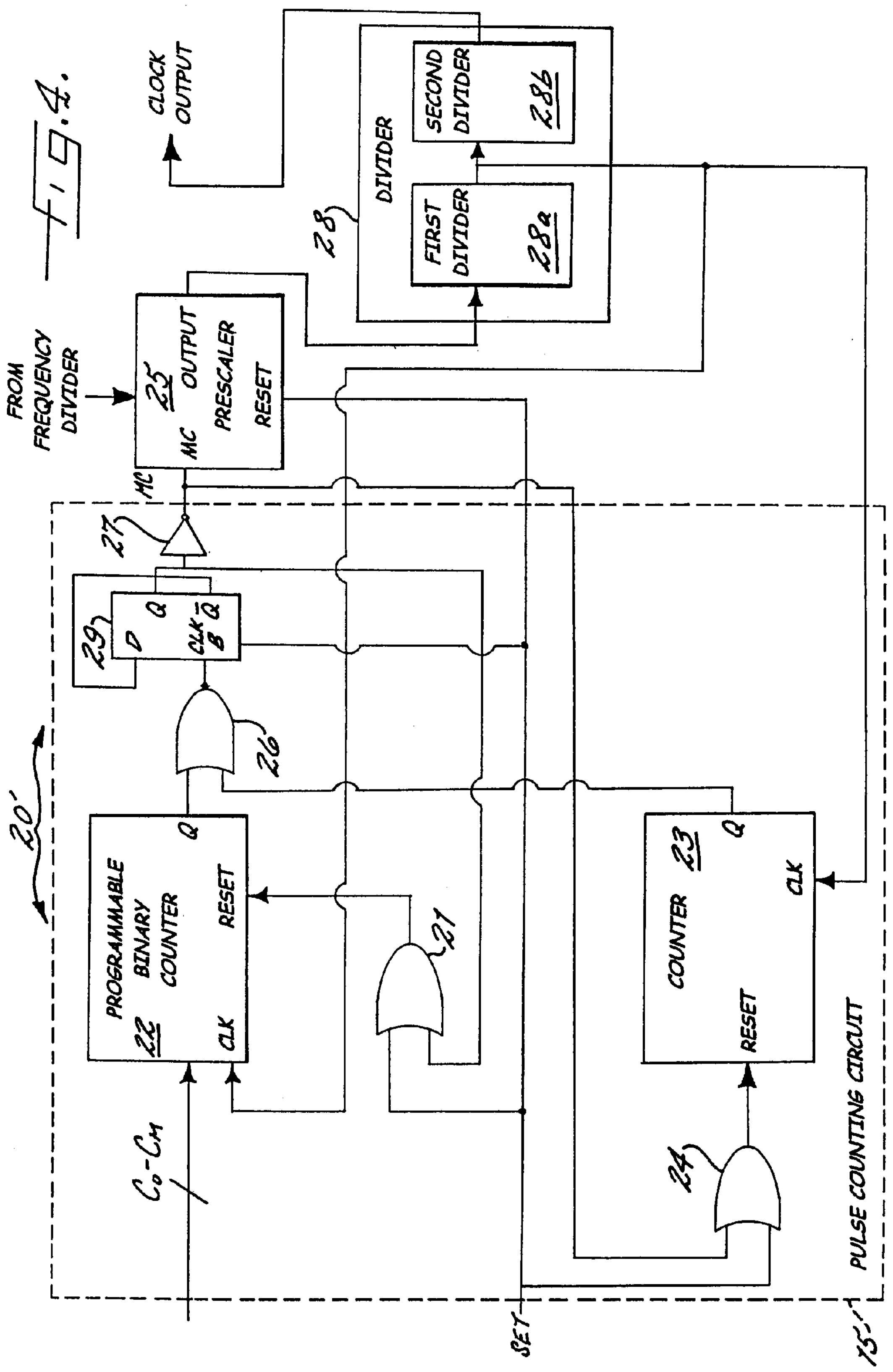
FIG. 4 is a schematic block diagram of a programmable scaling circuit of a temperature compensated clock according to an embodiment of the present invention.

As illustrated in FIGS. 1 and 4, the temperature compensating means 20 is preferably provided by a programmable scaling circuit 20' in one embodiment. The programmable scaling circuit can advantageously allow the clock designer to program the programmable scaling circuit 20' for a desired clock output frequency and a desired accuracy to thereby compensate for frequency variations due to temperature changes over time. The programmable scaling circuit 20' preferably includes pulse counting means, e.g., provided by a pulse counting circuit 15, for counting a total predetermined number of timing pulses. The pulse counting circuit 15 preferably includes a pair of counters 22, 23 or counting circuits configured so that each of the pair of counters 22, 23 counts only a portion of the total number of timing pulses.

As illustrated in FIG. 4, at least one, e.g., a first pulse counter, of the pair of counters 22, 23 preferably is a programmable binary counter ("PBC") 22, e.g., a flip-flop circuit, which is dependent on the digital input signal $C_0$–$C_M$ received from the latching circuit 36 of the temperature monitoring means 40. The PBC 22 preferably is programmed with a predetermined number of pulses, e.g., 240 pulses, selected by the designer based upon accuracy of a desired output timing signal for the clock 10. Although a larger number of pulses can increase accuracy of the clock 10, a balance or trade-off is made by the designer between increased accuracy and increased cost of the clock 10.

The output of the PBC 22 of the pulse counting circuit 15 connects to a NOR gate circuit 26 which also receives an output signal Q from the second pulse counter 23. The output of the NOR gate circuit 26 of the pulse counting circuit 15 then provides an inverted clocking signal CLKB to a D-type flip-flop circuit 29 as illustrated. The output signal Q from the D-type flip-flop circuit 29 is then inverted by an inverting circuit 27 of the pulse counting circuit 15. A control signal ("MC") is generated by the output of the inverting circuit 27. The control signal MC is then used as an input to the second pulse counter 23 and a prescaler 25.

The programmable scaling circuit 20' also includes the prescaler 25 which is responsive to the inverting circuit 27, i.e., the control signal MC, of the pulse counting circuit 15 and the frequency divider 14 of the waveform generating means 12 for scaling the frequency of the generated waveform signal. A dividing circuit 28 is connected to the prescaler 25 for dividing the scaled output signal. The dividing circuit 28, for example, can be a flip-flop circuit that divides a 100 Hz timing signal by 10, i.e., 28*a*, and divides a 10 Hz by 10 again, i.e., 28*b* to thereby produce a desired 1 Hz output timing signal.

The pulse counting circuit 15 of the programmable scaling circuit 20' preferably further includes the second pulse counter 23 connected to the dividing circuit 28 for counting timing pulses so that the dividing circuit produces a temperature compensated timing signal, e.g., a clock output, having a desired or preselected frequency, e.g., 1 Hz. The dividing circuit 28 preferably provides a clocking signal for both the PBC 22 and the second pulse counter 23 as illustrated. A reset signal is provided as one input to each of a pair of OR gates 21, 24 and to the D-type flip-flop circuit 29 of the pulse counting circuit 15 and as an input to the prescaler 25. The output Q of the D-type flip-flop circuit 29 provides the other or second input to one 21 of the OR gates 21, 24, and the control signal MC provides the other or second input to the second OR gate 24.

In operation, by use of the PBC 22 and the second pulse counter 23, when the control signal MC generated by the output of the PBC 22 is a logic high, the prescaler 25 divides the frequency of the waveform signal from the frequency divider 14, e.g., 4096 Hz signal, by a first predetermined value, e.g., 41 which is selected based upon a desired frequency output. When the control signal MC is a logic low, the prescaler 25 divides the 4096 Hz signal by a second predetermined value also selected based upon the desired frequency output, e.g., 40. The pulse counter 23 always counts a predetermined number of clock pulses which in this example is 10. With an input of 4096 Hz to the prescaler 25, for example, for a total of 250 pulses—240 pulses to generate a high control signal MC and another 10 pulses to generate a low control signal MC—the average output frequency will be exactly 100 Hz.

$$fave = \frac{250}{240\times\frac{41}{4096}+10\times\frac{40}{4096}} = 100\text{ Hz}$$

To adjust for the frequency variation due to temperature change, the PBC 22 is used to generate different frequencies. For example, with 239 pulses in the PBC 22, the output frequency can increase 3.9 ppm; with 236 pulses, +15.9 ppm; and with 216 pulses, +103.7 ppm. Based on the statistical data of a crystal oscillator, with the clock 10 and associated method described herein, the frequency advantageously can be controlled to ±5 ppm for 100 Hz with respect to room temperature frequency over a commercial temperature range (0° C.–70° C.). The dividing circuit 28 then divides the temperature compensated output timing signal, e.g., 100 Hz, from the prescaler 25 to produce a predetermined output timing signal, e.g., 1 Hz, which is the output of the clock 10. The present invention thereby advantageously provides a real time clock 10 that produces a timing signal which has been calibrated or compensated for various changes in temperature.

As illustrated in FIGS. 1–4, and as described above, the present invention also advantageously includes methods of clocking systems. As described above, by recognizing the flexible system constraints, for example, a simplified and inexpensive real time clock 10 and methods of clocking systems are provided according to the present invention. A method of clocking systems preferably includes generating a waveform signal at a preselected frequency and monitoring temperature variations responsive to an input voltage signal independent of temperature $V_{ref}$ and an input voltage signal proportional to temperature $V_{in}$. The method also includes generating a difference signal representative of the difference between the input voltage signal independent of temperature $V_{ref}$ and the input voltage signal proportional to temperature $V_{in}$, and scaling the frequency of the generated waveform responsive to the difference signal to thereby produce a temperature compensated output timing signal.

This method can additionally include converting the difference signal to a digital output difference signal and only periodically latching the digital output difference signal e.g., to assist in reducing power consumption. The scaling step includes counting a first predetermined number of pulses with a first counter, counting a second predetermined number of pulses with a second counter, and determining an average frequency scaled output responsive to the first and second predetermined number of pulses. The scaling step further includes dividing the scaled output to thereby produce a predetermined timing signal.

Another method of clocking systems includes monitoring an input voltage signal independent of temperature $V_{ref}$ and an input voltage signal proportional to temperature $V_{in}$, for variations in temperature. Frequency variations in a waveform generated by only one crystal oscillator are compensated for in a clock 10 system responsive to the monitored temperature variations to thereby produce a temperature compensated output timing signal.

This method also can include converting the difference signal to a digital output difference signal and only periodically latching the digital output difference signal. The temperature compensating step preferably includes scaling the frequency of the generated waveform responsive to a difference signal between the input voltage signal independent of temperature $V_{ref}$ and the input voltage signal proportional to temperature $V_{in}$. The scaling step includes counting a first predetermined number of pulses with a first counter, counting a second predetermined number of pulses with a second counter, and determining an average frequency scaled output responsive to the first and second predetermined number of pulses. The scaling step can also include dividing the scaled output to thereby produce a predetermined timing signal.

In the drawings and specification, there have been disclosed a typical preferred embodiment of the invention, and although specific terms are employed, the terms are used in a descriptive sense only and not for purposes of limitation. The invention has been described in considerable detail with specific reference to these illustrated embodiments. It will be apparent, however, that various modifications and changes can be made within the spirit and scope of the invention as described in the foregoing specification and as defined in the appended claims.

What is claimed is:

1. A method of clocking systems, the method comprising:

generating a waveform signal at a preselected frequency;

monitoring temperature variations responsive to a reference input voltage signal and an input voltage signal proportional to temperature based on a periodic sampling rate;

generating a difference signal representative of the difference between the reference input voltage signal and the input voltage signal proportional to temperature;

converting the difference signal to a digital output difference signal;

periodically latching the digital output difference signal based on a periodic sampling rate and producing a digital input signal as a calibration signal; and based on the calibration signal, scaling the frequency of the generated waveform responsive to the digital output difference signal to thereby produce a temperature compensated output timing signal.

2. A method as defined in claim 1, wherein the scaling step includes counting a first predetermined number of pulses with a first counter, counting a second predetermined number of pulses with a second counter, and determining an average frequency scaled output responsive to the first and second predetermined number of pulses.

3. A method as defined in claim 2, wherein the scaling step further includes dividing the scaled output to thereby produce a predetermined timing signal.

4. A method of producing a temperature compensated timing signal, the method comprising:

monitoring a reference input voltage signal and an input voltage signal proportional to temperature corresponding to variations in temperature at a periodic sampling rate; and compensating for frequency variations in a waveform generated by only one crystal oscillator using a difference signal between the reference input voltage signal and input voltage signal proportional to temperature, the compensating for frequency variations being responsive to monitored temperature variations to produce a temperature compensated output timing signal by converting the difference signal to a digital output difference signal and periodically latching the digital output difference signal based on the periodic sampling rate and producing a digital input signal as a calibration signal and based on the calibration signal, scaling the frequency of the generated waveform for producing a temperature compensated output timing signal.

5. A method as defined in claim 4, wherein the temperature compensating step includes scaling the frequency of the generated waveform responsive to a difference signal between the input voltage signal independent of temperature and the input voltage signal proportional to temperature.

6. A method as defined in claim 5, wherein the scaling step includes counting a first predetermined number of pulses with a first counter, counting a second predetermined number of pulses with a second counter, and determining an average frequency scaled output responsive to the first and second predetermined number of pulses.

7. A method as defined in claim 6, wherein the scaling step further includes dividing the scaled output to thereby produce a predetermined timing signal.

8. A method of producing a temperature compensated timing signal for a clock, the method comprising:

determining a difference between a reference input voltage signal and an input voltage signal proportional to temperature that is sampled at a periodic sampling rate;

producing an output difference signal as a voltage that is the difference between the reference input voltage and input voltage signal proportional to temperature;

converting the output difference signal to a digital difference output signal;

periodically latching the digital output difference signal based on a periodic sampling rate and producing a digital input signal as a calibration signal; and based on the calibration signal, compensating for frequency variations due to temperature changes in a waveform generate d by an oscillator responsive to the digital output difference signal to produce a temperature compensated output timing signal.

9. A method as defined in claim 8, further comprising scaling the frequency of the generated waveform from the oscillator responsive to the output difference signal.

10. A method as defined in claim 9, wherein the scaling step includes counting a first predetermined number of pulses with a first counter, counting a second predetermined number of pulses with a second counter, and determining an average frequency scaled output responsive to the first and second predetermined number of pulses.

11. A method as defined in claim 10, wherein the scaling step further includes dividing the scaled output to thereby produce a predetermined timing signal.

* * * * *